ced by examiner

United States Patent
Li

(10) Patent No.: US 10,803,809 B2
(45) Date of Patent: Oct. 13, 2020

(54) GATE DRIVING CIRCUIT, DRIVING METHOD THEREOF, AND DISPLAY DEVICE

(71) Applicant: Wuhan China Star Optoelectronics Technology Co., Ltd., Wuhan, Hubei (CN)

(72) Inventor: Yafeng Li, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 329 days.

(21) Appl. No.: 15/327,304

(22) PCT Filed: Dec. 29, 2016

(86) PCT No.: PCT/CN2016/113033
§ 371 (c)(1),
(2) Date: Sep. 18, 2017

(87) PCT Pub. No.: WO2018/107534
PCT Pub. Date: Jun. 21, 2018

(65) Prior Publication Data
US 2019/0259338 A1    Aug. 22, 2019

(30) Foreign Application Priority Data
Dec. 15, 2016 (CN) .......................... 2016 1 1161043

(51) Int. Cl.
*G09G 3/3266*    (2016.01)
*G09G 3/36*       (2006.01)
*G09G 3/20*       (2006.01)

(52) U.S. Cl.
CPC ............. *G09G 3/3266* (2013.01); *G09G 3/20* (2013.01); *G09G 3/3677* (2013.01); *G09G 2310/08* (2013.01)

(58) Field of Classification Search
CPC combination set(s) only.
See application file for complete search history.

(56) References Cited

U.S. PATENT DOCUMENTS

2010/0177082 A1* 7/2010 Joo ...................... G09G 3/3677
                                                                345/211
2015/0187320 A1* 7/2015 Ren ...................... G09G 3/3696
                                                                345/87

FOREIGN PATENT DOCUMENTS

CN            104282255         *   1/2015

* cited by examiner

*Primary Examiner* — Amr A Awad
*Assistant Examiner* — Jonathan G Cooper

(57) ABSTRACT

Disclosed are a gate driving circuit, a driving method thereof, and a display device which comprises the gate driving circuit. In the gate driving circuit, the $Q_n$ node in the $n^{th}$ stage circuit is precharged when an output signal of a $Q_{n-1}$ node in a previous stage driving circuit and an output signal of a $Q_{n+1}$ node in a next stage driving circuit are both in a high-level state. Both the $Q_n-1$ node and the $Q_{n+1}$ node are at low levels when the gate driving circuit is in an All Gate On display state, and thus a possibility of current leakage from the $Q_n$ node can be substantially reduced.

15 Claims, 3 Drawing Sheets

GATE DRIVING CIRCUIT, DRIVING METHOD THEREOF, AND DISPLAY DEVICE

CROSS-REFERENCE TO RELATED APPLICATIONS

The present application claims the priority of Chinese patent application CN201611161043.3, entitled "Gate Driving Circuit, Driving Method Thereof, and Display Device" and filed on Dec. 15, 2016, the entirety of which is incorporated herein by reference.

FIELD OF THE INVENTION

The present disclosure relates to the technical field of display, and in particular, to a gate driving circuit, a driving method thereof, and a display device manufactured based on the gate driving circuit and the driving method.

BACKGROUND OF THE INVENTION

Thin Film Transistor Liquid Crystal Display (TFT-LCD) and Active Matrix Organic Light Emitting Diode (AMO-LED) display devices are increasingly used in high-performance display fields due to their characteristics such as small sizes, low power consumption, no radiation and relatively low production costs.

The above-described display device is generally provided with a gate driver on array (GOA) circuit. In the GOA circuit, a gate scan driving signal circuit is formed on a TFT array substrate during a manufacturing procedure of a TFT array of an existing TFT-LCD. In the GOA circuit, an output terminal of each stage is connected with a row of gate line to output a gate scan signal to the gate line so as to realize row-by-row scanning of the gate lines.

With the development of low-temperature polysilicon (LTPS) semiconductor TFT, and due to the characteristics of the ultra-high carrier mobility of LTPS semiconductor, a corresponding integrated circuit on a panel has become a research focus. Many people are devoted to research of System on Panel (SOP) and related technologies, which has been realized gradually.

During design of an existing GOA circuit, an All Gate On function is needed to realize black frame insertion, and an All Gate Off function is needed to realize matching TP scanning. FIG. 1 shows an existing circuit, and FIGS. 2 and 3 respectively show forward and reverse scanning sequences. During a process of realizing the All Gate On function of the GOA circuit, electric potentials of Q nodes and P nodes of all-stage GOA units are all pulled down and electric potentials of $G_n$ nodes of all stages are all pulled up through a Reset 1 signal. During a process of realizing the All Gate Off function, electric potentials of $G_n$ nodes of all stages are all pulled down through a Reset 2 signal.

SUMMARY OF THE INVENTION

In view of the above technical defects in the prior art, the present disclosure aims to provide a gate driving circuit which has All Gate On and All Gate Off functions and can effectively prevent electric leakage of a Q node. Moreover, the present disclosure aims to provide a gate driving circuit with low power consumption during display.

In order to solve the above technical problems, the present disclosure provides a gate driving circuit, wherein the gate driving circuit has a multistage structure, and an $n^{th}$ stage circuit comprises a $Q_n$ node precharging unit, a $Q_n$ node pull-up unit, a $Q_n$ node pull-down unit, a $P_n$ node pull-up unit, a $P_n$ node pull-down unit, a $G_n$ output unit, a $G_n$ output terminal pull-down unit, a first reset unit and a second reset unit, wherein:

the $Q_n$ node precharging unit controls signal transmission between a high-voltage signal VGH and a $Q_n$ node under an effect of a first input signal $Q_{n-1}$ and a second input signal $Q_{n+1}$, so as to precharge the $Q_n$ node;

the $Q_n$ node pull-up unit is electrically connected between the $Q_n$ node and an output terminal $G_n$ to maintain the $Q_n$ node in a high-level state;

the $Q_n$ node pull-down unit is electrically connected between a low-voltage signal VGL and the $Q_n$ node to control signal transmission between the low-voltage signal VGL and the $Q_n$ node under an effect of a $P_n$ node voltage signal, so as to maintain the $Q_n$ node in a low-level state;

the $P_n$ node pull-up unit is electrically connected between the high-voltage signal VGH and a $P_n$ node to control signal transmission between the high-voltage signal VGH and the $P_n$ node under an effect of a first clock signal, so as to maintain the $P_n$ node in a high-level state;

the $P_n$ node pull-down unit is electrically connected between the low-voltage signal VGL and the $P_n$ node to control signal transmission between the low-voltage signal VGL and the $P_n$ node under an effect of a $Q_n$ node voltage signal, so as to maintain the $P_n$ node in a low-level state;

the $G_n$ output unit is electrically connected between a second clock signal and the output terminal $G_n$ to control signal transmission between the second clock signal and the output terminal $G_n$ under an effect of the $Q_n$ node voltage signal, so as to output a $G_n$ high-level signal;

the $G_n$ output terminal pull-down unit is electrically connected between the low-voltage signal VGL and the output terminal $G_n$ to control signal transmission between the low-voltage signal VGL and the output terminal $G_n$ under an effect of the $P_n$ node voltage signal, so as to maintain the output terminal $G_n$ in a low-level state;

the first input signal $Q_{n-1}$ is an output signal of $Q_{n-1}$ node in a previous stage driving circuit, and the second input signal $Q_{n+1}$ is an output signal of $Q_{n+1}$ node in a next stage driving circuit;

the first reset unit is connected with the low-voltage signal VHL, the $Q_n$ node, the $P_n$ node, the output terminal $G_n$ and a first reset signal Reset 1, and is configured to pull both the $Q_n$ node and the $P_n$ node down to a low level and simultaneously pull the output terminal $G_n$ up to a high level when the first reset signal Reset 1 jumps to a high level; and the second reset unit is connected with the voltage signal VHL, the output terminal $G_n$ and a first reset signal Reset 2, and is configured to pull the output terminal $G_n$ down to a low level when the second reset signal Reset 2 jumps to a high level.

When the first reset signal Reset 1 jumps to the high level, the second reset signal Reset 2 remains at a low level.

When the second reset signal Reset 2 jumps to the high level, the first reset signal Reset 1 remains at a low level.

In one embodiment, the $Q_n$ node precharging unit comprises a first transistor T1, a second transistor T2, a third transistor T3 and a fourth transistor T4. A source of the first transistor T1 is connected with the high-voltage signal VGH, a gate of the first transistor T1 is connected with the second input signal $Q_{n+1}$, and a drain of the first transistor T1 is connected with a source of the second transistor T2. A gate of the second transistor T2 is connected with the first input signal $Q_{n-1}$, and a drain of the second transistor T2 is connected with both a source of the third transistor T3 and the $Q_n$ node. A gate of the third transistor T3 is connected with the first input signal $Q_{n-1}$, and a drain of the third transistor T3 is connected with the source of the fourth transistor T4. A gate of the fourth transistor T4 is connected with the second input signal $Q_{n+1}$, and a drain of the fourth transistor T4 is connected with the high-voltage signal VGH.

In one embodiment, the $Q_n$ node pull-up unit comprises a first capacitor C1, and two ends of the first capacitor C1 are respectively connected with the $Q_n$ node and an output terminal $G_n$.

In one embodiment, the $Q_n$ node pull-down unit comprises a fifth transistor T5. A source of the fifth transistor T5 is connected with the $Q_n$ node, a gate of the fifth transistor T5 is connected with a $P_n$ node, and a drain of the fifth transistor T5 is connected with the low-voltage signal VGL.

In one embodiment, the $P_n$ node pull-up unit comprises a sixth transistor T6 and a second capacitor C2. A source of the sixth transistor T6 is connected with the high-voltage signal VGH, a gate of the sixth transistor T6 is connected with a first clock signal, and a drain of the sixth transistor T6 is connected with the $P_n$ node. Two ends of the second capacitor C2 are respectively connected with the $P_n$ node and the low-voltage signal VGL.

In one embodiment, the $P_n$ node pull-down unit comprises a seventh transistor T7. A source of the seventh transistor T7 is connected with the $P_n$ node, a gate of the seventh transistor T7 is connected with the $Q_n$ node, and a drain of the seventh transistor T7 is connected with the low-voltage signal VGL.

In one embodiment, the $G_n$ output unit comprises an eighth transistor T8. A source of the eighth transistor T8 is connected with a second clock signal, a gate of the eighth transistor T8 is connected with the $Q_n$ node, and a drain of the eighth transistor T8 is connected with the output terminal $G_n$.

In one embodiment, the $G_n$ output terminal pull-down unit comprises a ninth transistor T9. A source of the ninth transistor T9 is connected with the output terminal $G_n$, a gate of the ninth transistor T9 is connected with the $P_n$ node, and a drain of the ninth transistor T9 is connected with the low-voltage signal VGL.

In one embodiment, the first reset unit comprises a tenth transistor T10, an eleventh transistor T11 and a twelfth transistor T12. A source of the tenth transistor T10 is connected with the $Q_n$ node, a gate of the tenth transistor T10 is connected with the first reset signal Reset 1, and a drain of the tenth transistor T10 is connected with the low-voltage signal VGL. A source of the eleventh transistor T11 is connected with the output terminal $G_n$, and both a gate and a drain of the eleventh transistor T11 are connected with the first reset signal Reset 1. A source of the twelfth transistor T12 is connected with the $P_n$ node, a gate of the twelfth transistor T12 is connected with the first reset signal Reset 1, and the drain of the twelfth transistor T12 is connected with the low-voltage signal VGL.

In one embodiment, the second reset unit comprises a thirteenth transistor T13. A source of the thirteenth transistor T13 is connected with the output terminal $G_n$, a gate of the thirteenth transistor T13 is connected with the second reset signal Reset 2, and a drain of the thirteenth transistor T13 is connected with the low-voltage signal VGL.

According to another aspect of the present disclosure, a gate driving method is provided, which comprises the following phases during forward scanning and reverse scanning.

The forward scanning phase will be described below.

Both a first reset signal Reset 1 and a second reset signal Reset 2 are maintained at a low level under normal display conditions.

In phase a, when a first input signal $Q_{n-1}$ and a second input signal $Q_{n+1}$ are both in a high-level state, a first transistor and a second transistor are both turned on and in series connection with each other, and a third transistor and a fourth transistor are also both turned on and in series connection with each other, so as to precharge a $Q_n$ node at the same time.

In phase b, the $Q_n$ node is precharged in phase a, a first capacitor C1 in a $Q_n$ node pull-up unit maintains the $Q_n$ node in a high-level state, an eighth transistor T8 in a $G_n$ output unit is in a turned-on state, and a high level of a second clock signal is output to an output terminal $G_n$.

In phase c, the first capacitor C1 in the $Q_n$ node pull-up unit continues to maintain the $Q_n$ node in the high-level state, while at this moment, a low level of the second clock signal pulls down a level of the output terminal $G_n$, and when the first input signal $Q_{n-1}$ and the second input signal $Q_{n+1}$ are simultaneously at high level, the first, second, third and fourth transistors are all turned on and in series connection with one another, and the $Q_n$ node is supplementarily charged.

In phase d, when a first clock signal is at a high level, a sixth transistor T6 in a $P_n$ node pull-up unit is in a turned-on state, a level of a $P_n$ node is pulled up, a fifth transistor T5 in a $Q_n$ node pull-down unit is turned on, and at this moment, a level of the $Q_n$ node is pulled down to VGL.

In phase e, a seventh transistor in a $P_n$ node pull-down unit is in a turned-off state after the $Q_n$ node is changed to a low level, the sixth transistor T6 is turned on when a first clock signal jumps to a high level, the $P_n$ node is charged, and then the fifth transistor T5, and a ninth transistor T9 of a $G_n$ output terminal pull-down unit are both in a turned-on state, thus the stability of the low levels of the $Q_n$ node and the output terminal $G_n$ can be ensured, and meanwhile, a second capacitor C2 plays a certain role in maintaining the high level of the $P_n$ node.

Both the first reset signal Reset 1 and the second reset signal Reset 2 are maintained at a low level under normal display conditions, and thus a tenth transistor T10, an eleventh transistor T11, a twelfth transistor T12 and a thirteenth transistor T13 are all in a turned-off state.

During an All Gate On display state, the first reset signal Reset 1 is at a high level and the second reset signal Reset 2 is at a low level; and when the first reset signal Reset 1 jumps to the high level, the tenth transistor T10, the eleventh transistor T11 and the twelfth transistor T12 are all in a turned-on state, while the thirteenth transistor T13 is in a turned-off state. At this moment, the $Q_n$ node and the $P_n$ node are both pulled down to low levels, and the output terminal $G_n$ is pulled up to a high level.

During an All Gate Off display state, the first reset signal Reset 1 is at a low level and the second reset signal Reset 2 is at a high level; and when the first reset signal Reset 1 is at the low level, the tenth transistor T10, the eleventh transistor T11 and the twelfth transistor T12 are all in a turned-off state, while the thirteenth transistor T13 is in a turned-on state. At this moment, the output terminal $G_n$ is pulled down to a low level.

The reverse scanning phase will be described below.

In the normal display state, both the first reset signal Reset 1 and the second reset signal Reset 2 are maintained at a low level.

In phase 1, when the first input signal $Q_{n-1}$ and the second input signal $Q_{n+1}$ are both in the high-level state, the first transistor and the second transistor are both turned on and in series connection with each other, and the third transistor and the fourth transistor are also both turned on and in series connection with each other, so as to precharge the $Q_n$ node simultaneously.

In phase 2, the $Q_n$ node is precharged in phase 1, the first capacitor C1 in the $Q_n$ node pull-up unit maintains the $Q_n$ node in a high-level state, the eighth transistor T8 in the $G_n$ output unit is in a turned-on state, and a high level of the second clock signal is output to the output terminal $G_n$.

In phase 3, the first capacitor C1 in the $Q_n$ node pull-up unit continues to maintain the $Q_n$ node in the high-level state, while at this moment a low level of the second clock signal pulls down a level of the output terminal $G_n$, and when the first input signal $Q_{n-1}$ and the second input signal $Q_{n+1}$ are simultaneously at high level, the first, second, third and fourth transistors are all turned on and in series connection with one another, and the $Q_n$ node is supplementarily charged.

In phase 4, when the first clock signal is at a high level, the sixth transistor T6 in the $P_n$ node pull-up unit is in a turned-on state, a level of the $P_n$ node is pulled up, the fifth transistor T5 in the $Q_n$ node pull-down unit is turned on, and at this moment a level of the $Q_n$ node is pulled down to VGL.

In phase 5, the seventh transistor in the $P_n$ node pull-down unit is in a turned-off state after the $Q_n$ node changes to the low level, the sixth transistor T6 is turned on when the first clock signal jumps to the high level, the $P_n$ node is charged, and then the fifth transistor T5 and the ninth transistor T9 of the $G_n$ output terminal pull-down unit are both in a turned-on state, thus the stability of the low levels of the $Q_n$ node and the output terminal $G_n$ can be ensured, and meanwhile, the second capacitor C2 plays a certain role in maintaining the high level of the $P_n$ node.

Both the first reset signal Reset 1 and the second reset signal Reset 2 are maintained at a low level under normal display conditions, and thus the tenth transistor T10, the eleventh transistor T11, the twelfth transistor T12 and the thirteenth transistor T13 are all in a turned-off state.

During an All Gate On display state, the first reset signal Reset 1 is at a high level and the second reset signal Reset 2 is at a low level; and when the first reset signal Reset 1 jumps to the high level, the tenth transistor T10, the eleventh transistor T11 and the twelfth transistor T12 are all in a turned-on state, while the thirteenth transistor T13 is in a turned-off state. At this moment, the $Q_n$ node and the $P_n$ node are both pulled down to low levels, and the output terminal $G_n$ is pulled up to a high level.

During an All Gate Off display state, the first reset signal Reset 1 is at a low level and the second reset signal Reset 2 is at a high level; and when the first reset signal Reset 1 is at the low level, the tenth transistor T10, the eleventh transistor T11 and the twelfth transistor T12 are all in a turned-off state, while the thirteenth transistor T13 is in a turned-on state. At this moment, the output terminal $G_n$ is pulled down to a low level.

Compared with the prior art, one embodiment or more embodiments of the present disclosure can have the following advantages.

In the gate driving circuit of the present disclosure, the $Q_n$ node in the $n^{th}$ stage circuit is precharged when an output signal of a $Q_{n-1}$ node in a previous stage driving circuit and an output signal of a $Q_{n+1}$ node in a next stage driving circuit are both in the high-level state. Both the $Q_{n-1}$ node and the $Q_{n+1}$ node are at low levels when the gate driving circuit is in the All Gate On display state, and thus a possibility of electric leakage from the $Q_n$ node can be greatly reduced. Meanwhile, the high-voltage signal VGH is used during both forward scanning and reverse scanning of the $Q_n$ node precharging unit, so that no paths can be formed among voltage signal sources, and the power consumption of the circuit can be effectively reduced.

Other features and advantages of the present disclosure will be further explained in the following description, and partly become self-evident therefrom, or be understood through implementation of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawings.

LIST OF REFERENCE SIGNS

1. $Q_n$ node precharging unit;
2. $Q_n$ node pull-up unit;
3. $Q_n$ node pull-down unit;
4. $P_n$ node pull-up unit;
5. $P_n$ node pull-down unit;
6. $G_n$ output unit;
7. $G_n$ output terminal pull-down unit;
8. High-voltage signal VGH;
9. Low-voltage signal VGL;
10. $Q_n$ node;
11. First input signal $Q_{n-1}$;
12. Second input signal $Q_{n+1}$;
13. $P_n$ node;
14. Output terminal $G_n$;
30. First reset unit; and
31. Second reset unit.

DETAILED DESCRIPTION OF THE EMBODIMENTS

In order to present the purpose, technical solution, and advantages of the present disclosure more explicitly, the present disclosure will be further explained in detail in connection with the accompanying drawings.

Figure 1:
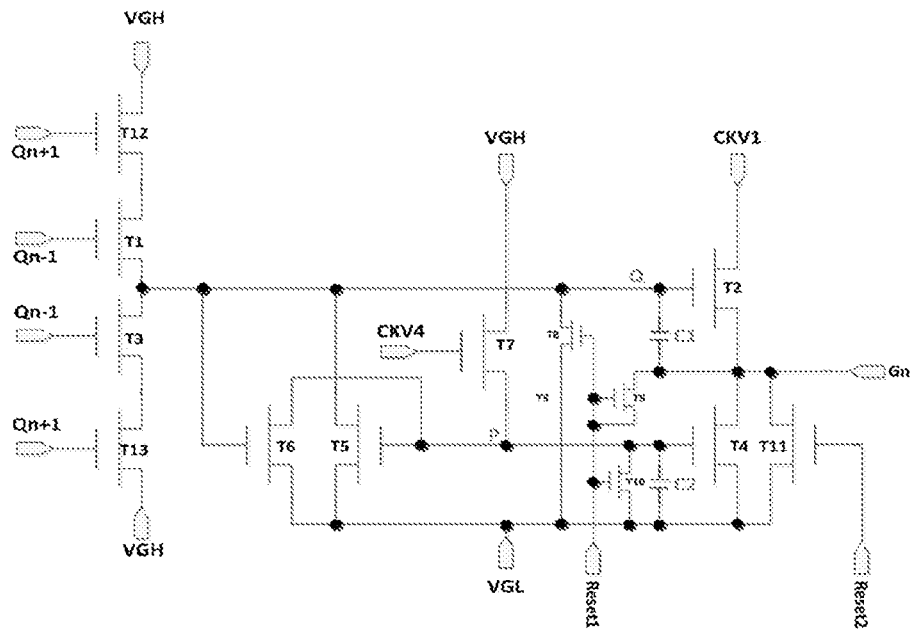
FIG. 1 schematically shows a gate driving circuit in the prior art.
Figure 2:
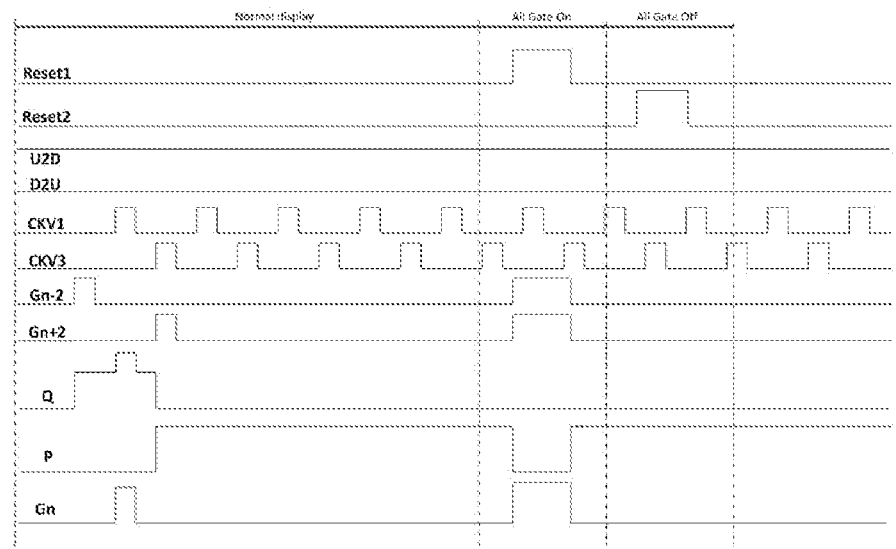
FIG. 2 schematically shows a time-sequence diagram of forward scanning of a gate driving circuit in the prior art.
Figure 3:
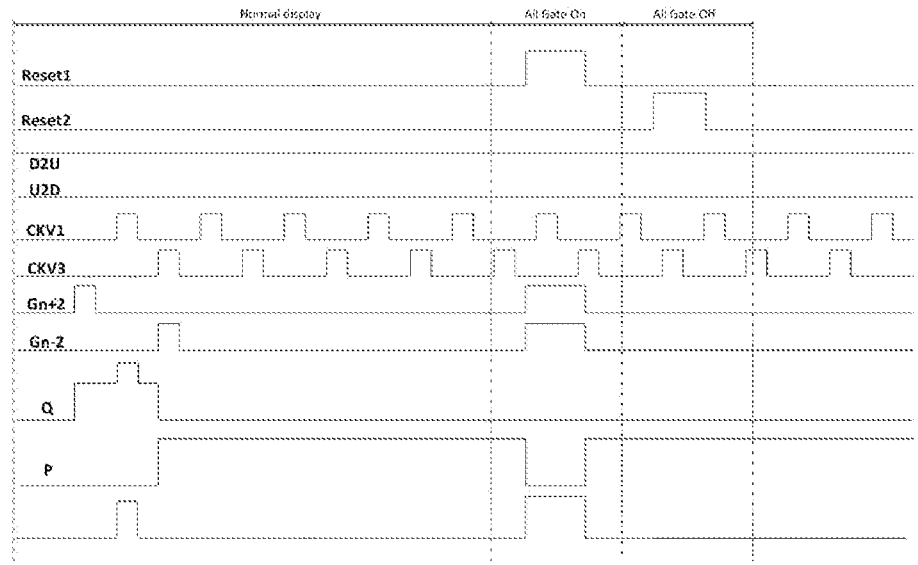
FIG. 3 schematically shows a time-sequence diagram of reverse scanning of a gate driving circuit in the prior art.

As shown in FIG. 1, Q node and P node can be introduced in order to ensure stability of an output point $G_n$ when a traditional gate driver on array circuit is designed. A signal time-sequence diagram of the gate driving circuit is shown in FIG. 2 during forward scanning, and a signal time-sequence diagram of the gate driving circuit is shown in FIG. 3 during reverse canning. It can be seen from FIG. 1 that, when all $G_n$ s are pulled-up, i.e., when all $G_n$, $G_{n-2}$ and $G_{n+2}$ are at a high level, both T1 and T3 are in a turned-on state, and there is a large possibility of electric leakage at the Q node. Moreover, U2D and D2U are at relatively a high level and a low level, and when T1 and T3 are simultaneously turned on, a certain conductive path can be formed between U2D and D2U. As a result, the corresponding power consumption will also be increased.

Therefore, the present disclosure provides a gate driving circuit which has All Gate On and All Gate Off functions and is capable of effectively avoiding electric leakage of Q node.

Embodiment 1

Figure 4:
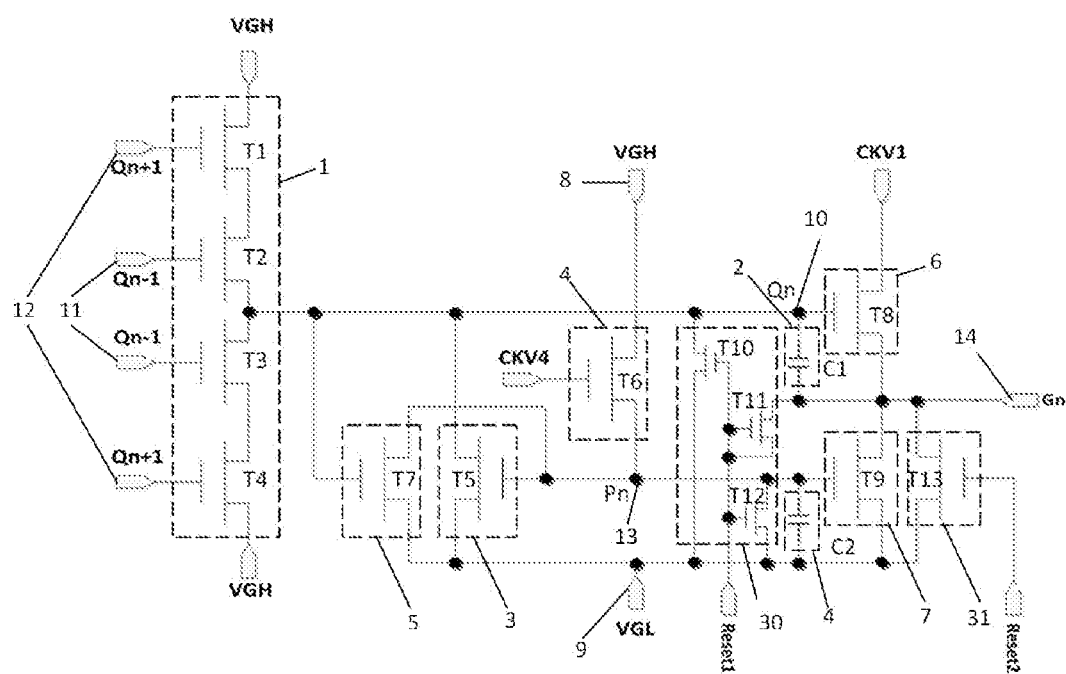
FIG. 4 schematically shows a gate driving circuit according to the present disclosure.

FIG. 4 schematically shows a gate driving circuit according to the embodiment of the present disclosure. The gate driving circuit will be explained below combining FIG. 4.

The gate driving circuit shown in FIG. 4 has a multistage structure, an $n^{th}$ stage circuit of the gate driving circuit comprises a $Q_n$ node precharging unit 1, a $Q_n$ node pull-up unit 2, a $Q_n$ node pull-down unit 3, a $P_n$ node pull-up unit 4, a $P_n$ node pull-down unit 5, a $G_n$ output unit 6, a $G_n$ output terminal pull-down unit 7, a first reset unit 30 and a second reset unit 31.

The $Q_n$ node precharging unit 1 is connected with a first input signal $Q_{n-1}$ 11, a second input signal $Q_{n+1}$ 12 and a high-voltage signal VGH 8. The first input signal $Q_{n-1}$ 11 is an output signal of a $Q_n$–1 node in a previous stage driving circuit, and the second input signal $Q_{n+1}$ 12 is an output signal of a $Q_{n+1}$ node in a next stage driving circuit. Signal transmission between the high-voltage signal VGH 8 and a $Q_n$ node 10 is controlled by the first input signal $Q_{n-1}$ 11 and the second input signal $Q_{n+1}$ 12 through the $Q_n$ node precharging unit 1, so that precharging of the $Q_n$ node 10 is realized.

The $Q_n$ node precharging unit 1 comprises a first transistor T1, a second transistor T2, a third transistor T3 and a fourth transistor T4. A source of the first transistor T1 is connected with the high-voltage signal VGH 8, a gate of the first transistor T1 is connected with the second input signal $Q_{n+1}$ 12, and a drain of the first transistor T1 is connected with a source of the second transistor T2. A gate of the second transistor T2 is connected with the first input signal $Q_{n-1}$ 11, and a drain of the second transistor T2 is connected with both a source of the third transistor T3 and the $Q_n$ node 10. A gate of the third transistor T3 is connected with the first input signal $Q_{n-1}$ 11, and a drain of the third transistor T3 is connected with the source of the fourth transistor T4. A gate of the fourth transistor T4 is connected with the second input signal $Q_{n+1}$ 12, and a drain of the fourth transistor T4 is connected with the high-voltage signal VGH 8.

The $Q_n$ node pull-up unit 2 is configured to maintain the $Q_n$ node 10 in a high-level state. The $Q_n$ node pull-up unit 2 comprises a first capacitor C1, and two ends of the first capacitor C1 are respectively connected with the $Q_n$ node 10 and an output terminal $G_n$ 14.

The $Q_n$ node pull-down unit 3 is connected with a low-voltage signal VGL 9 and is configured to maintain the $Q_n$ node 10 in a low-level state. The $Q_n$ node pull-down unit 3 comprises a fifth transistor T5. A source of the fifth transistor T5 is connected with the $Q_n$ node 10, a gate of the fifth transistor T5 is connected with a $P_n$ node 13, and a drain of the fifth transistor T5 is connected with the low-voltage signal VGL 9.

The $P_n$ node pull-up unit 4 is connected with the high-voltage signal VGH 8 and a clock signal CKV 4 and is configured to control the signal transmission between the high-voltage signal VGH 8 and the $P_n$ node 13. The $P_n$ node pull-up unit 4 comprises a sixth transistor T6 and a second capacitor C2. A source of the sixth transistor T6 is connected with the high-voltage signal VGH 8, a gate of the sixth transistor T6 is connected with the clock signal CKV 4, and a drain of the sixth transistor T6 is connected with the $P_n$ node 13. Two ends of the second capacitor C2 are respectively connected with the $P_n$ node 13 and the low-voltage signal VGL 9.

The $P_n$ node pull-down unit 5 is connected with a low-voltage signal VGL 9 and is configured to maintain the $P_n$ node 13 in a low-level state. The $P_n$ node pull-down unit 5 comprises a seventh transistor T7. A source of the seventh transistor T7 is connected with the $P_n$ node, a gate of the seventh transistor T7 is connected with the $Q_n$ node 10, and a drain of the seventh transistor T7 is connected with the low-voltage signal VGL 9.

The $G_n$ output unit 6 is connected with a clock signal CKV 1 and the output terminal $G_n$ 14 and is configured to control signal transmission between the clock signal CKV 1 and the output terminal $G_n$ 14. In one embodiment, the $G_n$ output unit 6 comprises an eighth transistor T8. A source of the eighth transistor T8 is connected with the clock signal CKV 1, a gate of the eighth transistor T8 is connected with the $Q_n$ node 10, and a drain of the eighth transistor T8 is connected with the output terminal $G_n$ 14.

The $G_n$ output terminal pull-down unit 7 is connected with the low-voltage signal VGL 9 and the output terminal $G_n$ 14 and is configured to maintain the output terminal $G_n$ 14 in a low-level state. The $G_n$ output terminal pull-down unit 7 comprises a ninth transistor T9. A source of the ninth transistor T9 is connected with the output terminal $G_n$ 14, a gate of the ninth transistor T9 is connected with the $P_n$ node 13, and a drain of the ninth transistor T9 is connected with the low-voltage signal VGL 9.

The first reset unit 30 is connected with a low-voltage signal VHL 9, the $Q_n$ node 10, the $P_n$ node 13, the output terminal $G_n$ 14 and a first reset signal Reset 1 and is configured to pull both the $Q_n$ node 10 and the $P_n$ node 13 down to a low level and simultaneously pull the output terminal $G_n$ 14 up to a high level when the first reset signal Reset 1 jumps to a high level.

The first reset unit 30 comprises a tenth transistor T10, an eleventh transistor T11 and a twelfth transistor T12. A source of the tenth transistor T10 is connected with the $Q_n$ node 10, a gate of the tenth transistor T10 is connected with the first reset signal Reset 1, and a drain of the tenth transistor T10 is connected with the low-voltage signal VGL 9. A source of the eleventh transistor T11 is connected with the output terminal $G_n$ 14, and both a gate and a drain of the eleventh transistor T11 are connected with the first reset signal Reset 1. A source of the twelfth transistor T12 is connected with the $P_n$ node 13, a gate of the twelfth transistor T12 is connected with the first reset signal Reset 1, and the drain of the twelfth transistor T12 is connected with the low-voltage signal VGL.

The second reset unit is connected with the voltage signal VHL 9, the output terminal $G_n$ 14 and a first reset signal Reset 2 and is configured to pull the output terminal $G_n$ 14 down to a low level when the second reset signal Reset 2 jumps to a high level.

The second reset signal Reset 2 remains at the low level when the first reset signal Reset 1 jumps to the high level.

The first reset signal Reset 1 remains at the low level when the second reset signal Reset 2 jumps to the high level.

The technical effects of the present embodiment will be described as follows. The $Q_n$ node in the $n^{th}$ stage circuit of the gate driving circuit is precharged when an output signal of a $Q_{n-1}$ node in a previous stage driving circuit and an output signal of a $Q_{n+1}$ node in a next stage driving circuit are both in the high-level state. Both the $Q_{n-1}$ node and the $Q_{n+1}$ node are at low levels when the gate driving circuit is in the All Gate On display state, and thus a possibility of electric leakage from the $Q_n$ node can be greatly reduced. Meanwhile, the high-voltage signal VGH is used during both forward scanning and reverse scanning of the $Q_n$ node precharging unit, so that no paths can be formed among voltage signal sources, and the power consumption of the circuit can be effectively reduced.

Embodiment 2

Based on the gate driving circuit provided by embodiment 1, the present embodiment provides a driving method for the gate driving circuit.

Figure 5:
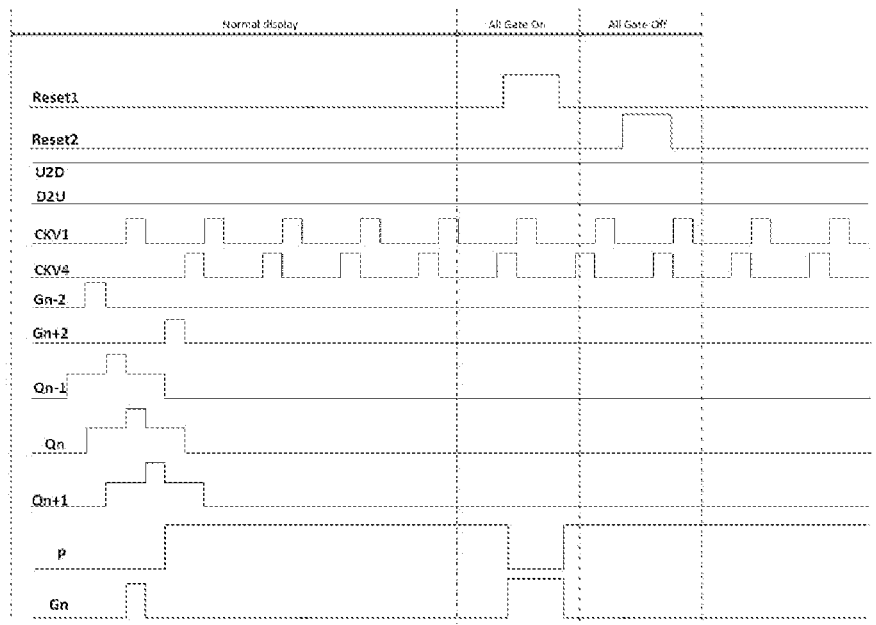
FIG. 5 schematically shows a time-sequence diagram of forward scanning of a gate driving circuit according to the present disclosure.

During forward scanning, a signal time-sequence diagram of the driving method is shown in FIG. 5, and the scanning process comprises phases a to e as follows.

Both a first reset signal Reset 1 and a second reset signal Reset 2 are maintained at a low level under normal display conditions.

In phase a, when a first input signal $Q_{n-1}$ 11 and a second input signal $Q_{n+1}$ 12 are both in a high-level state, a first transistor and a second transistor are both turned on and in series connection with each other, and a third transistor and a fourth transistor are also both turned on in series connection with each other, so as to precharge a $Q_n$ node 10 at the same time.

In phase b, the $Q_n$ node 10 is precharged in phase a, a first capacitor C1 in a $Q_n$ node 10 pull-up unit maintains the $Q_n$ node 10 in a high-level state, an eighth transistor T8 in a $G_n$ output unit 6 is in a turned-on state, and a high level of a second clock signal is output to an output terminal $G_n$ 14.

In phase c, the first capacitor C1 in the $Q_n$ node pull-up unit 2 continues to maintain the $Q_n$ node 10 in the high-level state, while at this moment a low level of the second clock signal pulls down a level of the output terminal $G_n$ 14, and when the first input signal $Q_{n-1}$ 11 and the second input signal $Q_{n+1}$ 12 are simultaneously at high level, the first, second, third and fourth transistors are all turned on and in series connection with one another, and the $Q_n$ node 10 is supplementarily charged.

In phase d, when a first clock signal is at a high level, a sixth transistor T6 in a $P_n$ node pull-up unit 4 is in a turned-on state, a level of a $P_n$ node 13 is pulled up, a fifth transistor T5 in a $Q_n$ node pull-down unit 3 is turned on, and at this moment, a level of the $Q_n$ node 10 is pulled down to a low-voltage signal VGL 9.

In phase e, a seventh transistor in a $P_n$ node pull-down unit 5 is in a turned-off state after the $Q_n$ node 10 is changed to a low level, the sixth transistor T6 is turned on when a first clock signal jumps to a high level, the $P_n$ node 13 is charged, and then the fifth transistor T5, and a ninth transistor T9 of a $G_n$ output terminal pull-down unit 7 are both in a turned-on state, thus the stability of the low levels of the $Q_n$ node 10 and the output terminal $G_n$ 14 can be ensured, and meanwhile, a second capacitor C2 plays a certain role in maintaining the high level of the $P_n$ node 13.

Both the first reset signal Reset 1 and the second reset signal Reset 2 are maintained at a low level under normal display conditions, and thus a tenth transistor T10, an eleventh transistor T11, a twelfth transistor T12 and a thirteenth transistor T13 are all in a turned-off state.

During an All Gate On display state, the first reset signal Reset 1 is at a high level and the second reset signal Reset 2 is at a low level; and when the first reset signal Reset 1 jumps to the high level, the tenth transistor T10, the eleventh transistor T11 and the twelfth transistor T12 are all in a turned-on state, while the thirteenth transistor T13 is in a turned-off state. At this moment, the $Q_n$ node 10 and the $P_n$ node 13 are both pulled down to low levels, and the output terminal $G_n$ 14 is pulled up to a high level.

During an All Gate Off display state, the first reset signal Reset 1 is at a low level and the second reset signal Reset 2 is at a high level; and when the first reset signal Reset 1 is at the low level, the tenth transistor T10, the eleventh transistor T11 and the twelfth transistor T12 are all in a turned-off state, while the thirteenth transistor T13 is in a turned-on state. At this moment, the output terminal $G_n$ 14 is pulled down to a low level.

Figure 6:
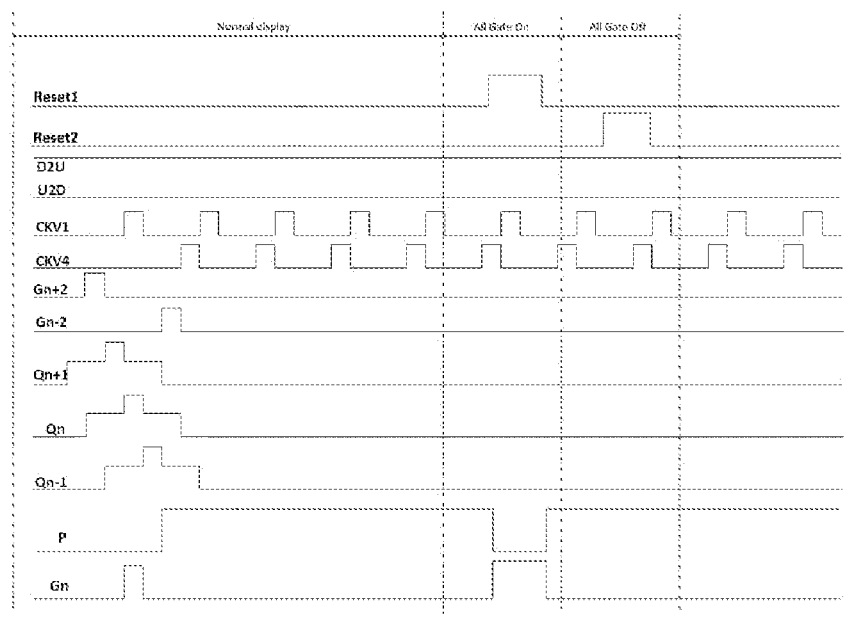
FIG. 6 schematically shows a time-sequence diagram of reverse scanning of a gate driving circuit according to the present disclosure.

During reverse scanning, a signal time-sequence diagram of the driving method is shown in FIG. 6, and the scanning process comprises phases 1 to 5 as follows.

Both the first reset signal Reset 1 and the second reset signal Reset 2 are maintained at a low level under normal display conditions.

In phase 1, when the first input signal $Q_{n-1}$ 11 and a second input signal $Q_{n+1}$ 12 are both in a high-level state, the first transistor and the second transistor are both turned on and in series connection with each other, and the third transistor and the fourth transistor are also both turned on and in series connection with each other, so as to precharge the $Q_n$ node 10 simultaneously.

In phase 2, the $Q_n$ node 10 is precharged in phase 1, the first capacitor C1 in the $Q_n$ node 10 pull-up unit maintains the $Q_n$ node 10 in a high-level state, the eighth transistor T8 in the $G_n$ output unit 6 is in a turned-on state, and a high level of the second clock signal is output to the output terminal $G_n$ 14.

In phase 3, the first capacitor C1 in the $Q_n$ node pull-up unit 2 continues to maintain the $Q_n$ node 10 in the high-level state, while at this moment a low level of the second clock signal pulls down a level of the output terminal $G_n$ 14, and when the first input signal $Q_{n-1}$ 11 and the second input signal $Q_{n+1}$ 12 are simultaneously at high level, the first, second, third and fourth transistors are all turned on and in series connection with one another, and the $Q_n$, node 10 is supplementarily charged.

In phase 4, when the first clock signal is at a high level, the sixth transistor T6 in the $P_n$ node pull-up unit 4 is in a turned-on state, a level of the $P_n$ node 13 is pulled up, the fifth transistor T5 in the $Q_n$ node pull-down unit 3 is turned on, and at this moment a level of the $Q_n$ node 10 is pulled down to the low-voltage signal VGL 9.

In phase 5, the seventh transistor in the $P_n$ node pull-down unit 5 is in a turned-off state after the $Q_n$ node 10 is changed to a low level, the sixth transistor T6 is turned on when the first clock signal jumps to a high level, the $P_n$ node 13 is charged, and then the fifth transistor T5 and the ninth transistor T9 of the $G_n$ output terminal pull-down unit 7 are both in a turned-on state, thus the stability of the low levels of the $Q_n$ node 10 and the output terminal $G_n$ 14 can be ensured, and meanwhile, the second capacitor C2 plays a certain role in maintaining the high level of the $P_n$ node 13.

Both the first reset signal Reset 1 and the second reset signal Reset 2 are maintained at a low level under normal display conditions, and thus the tenth transistor T10, the eleventh transistor T11, the twelfth transistor T12 and the thirteenth transistor T13 are all in a turned-off state.

During an All Gate On display state, the first reset signal Reset 1 is at a high level and the second reset signal Reset 2 is at a low level; and when the first reset signal Reset 1 jumps to the high level, the tenth transistor T10, the eleventh transistor T11 and the twelfth transistor T12 are all in a turned-on state, while the thirteenth transistor T13 is in a turned-off state. At this moment, the $Q_n$ node and the $P_n$ node are both pulled down to low levels, and the output terminal $G_n$ is pulled up to a high level.

During an All Gate Off display state, the first reset signal Reset 1 is at a low level and the second reset signal Reset 2 is at a high level; and when the first reset signal Reset 1 is at the low level, the tenth transistor T10, the eleventh transistor T11 and the twelfth transistor T12 are all in a turned-off state, while the thirteenth transistor T13 is in a turned-on state. At this moment, the output terminal $G_n$ is pulled down to a low level.

The technical effects of the present embodiment will be described as follows. The $Q_n$ node in the $n^{th}$ stage circuit of the gate driving circuit is precharged when an output signal of a $Q_{n-1}$ node in a previous stage driving circuit and an output signal of a $Q_{n+1}$ node in a next stage driving circuit are both in the high-level state. Both the $Q_{n-1}$ node and the $Q_{n+1}$ node are at low levels when the gate driving circuit is in the All Gate On display state, and thus a possibility of electric leakage from the $Q_n$ node can be greatly reduced. Meanwhile, the high-voltage signal VGH is used during both forward scanning and reverse scanning of the $Q_n$ node precharging unit, so that no paths can be formed among voltage signal sources, and the power consumption of the circuit can be effectively reduced.

Embodiment 3

Based on the foregoing embodiments 1 and 2, the present embodiment provides a display device. The display device comprises a display panel and a peripheral driving circuit, and the display panel can be a liquid crystal display panel, a plasma display panel, a light emitting diode display panel or an organic light emitting diode display panel and the like. The peripheral driving circuit comprises a gate driving circuit and an image signal driving circuit. The gate driving circuit described in embodiment 1 is used. When the display device provided herein is in operation, the operating procedure of the gate driving circuit thereof is performed by the gate driving method provided by embodiment 2.

The technical effects of the embodiment lie in that, the signal output by the gate driving circuit of the display device is stable, and therefore, the display effect is more stable than that of the display device in the prior art, and the phenomena such as image smear and dithering can be greatly reduced.

Compared with the prior art, one embodiment or more embodiments of the present disclosure can have the following advantages. In the gate driving circuit of the present disclosure, the $Q_n$ node in the $n^{th}$ stage circuit is precharged when an output signal of a $Q_{n-1}$ node in a previous stage driving circuit and an output signal of a $Q_{n+1}$ node in a next stage driving circuit are both in a high-level state. Both the $Q_{n-1}$ node and the $Q_{n+1}$ node are at low levels when the gate driving circuit is in the All Gate On display state, and thus a possibility of electric leakage from the $Q_n$ node can be greatly reduced. Meanwhile, the high-voltage signal VGH is used during both forward scanning and reverse scanning of the $Q_n$ node precharging unit, so that no paths can be formed among voltage signal sources, and the power consumption of the circuit can be effectively reduced.

The above description should not be construed as limitations of the present disclosure, but merely as exemplifications of preferred embodiments thereof. Any variations or replacements that can be readily envisioned by those skilled in the art are intended to be within the scope of the present disclosure. Hence, the scope of the present disclosure should be subject to the scope defined in the claims.

The invention claimed is:

1. A gate driving circuit, wherein the gate driving circuit has a multistage structure, and an $n^{th}$ stage circuit comprises:
   a $Q_n$ node precharging unit, which controls signal transmission between a high-voltage signal VGH and a $Q_n$ node under an effect of a first input signal $Q_{n-1}$ and a second input signal $Q_{n+1}$, so as to precharge the $Q_n$ node, wherein the first input signal $Q_{n-1}$ is an output signal at a $Q_{n-1}$ node in an $(n-1)^{th}$ stage circuit and the second input signal $Q_{n+1}$ is an output signal at a $Q_{n+1}$ node in an $(n+1)^{th}$ stage circuit;
   a $Q_n$ node pull-up unit, which is electrically connected between the $Q_n$ node and an output terminal $G_n$ to maintain the $Q_n$ node in a high-level state;
   a $Q_n$ node pull-down unit, which is electrically connected between a low-voltage signal VGL and the $Q_n$ node to control signal transmission between the low-voltage signal VGL and the $Q_n$ node under an effect of a $P_n$ node voltage signal, so as to maintain the $Q_n$ node in a low-level state;
   a $P_n$ node pull-up unit, which is electrically connected between the high-voltage signal VGH and a $P_n$ node to control signal transmission between the high-voltage signal VGH and the $P_n$ node under an effect of a first clock signal, so as to maintain the $P_n$ node in a high-level state;
   a $P_n$ node pull-down unit, which is electrically connected between the low-voltage signal VGL and the $P_n$ node to control signal transmission between the low-voltage signal VGL and the $P_n$ node under an effect of a $Q_n$ node voltage signal, so as to maintain the $P_n$ node in a low-level state;
   a $G_n$ output unit, which is electrically connected between a second clock signal and the output terminal $G_n$ to control signal transmission between the second clock signal and the output terminal $G_n$ under an effect of the $Q_n$ node voltage signal, so as to output a $G_n$ high-level signal;
   a $G_n$ output terminal pull-down unit, which is electrically connected between the low-voltage signal VGL and the output terminal $G_n$ to control signal transmission between the low-voltage signal VGL and the output terminal $G_n$ under an effect of the $P_n$ node voltage signal, so as to maintain the output terminal $G_n$ in a low-level state;
   a first reset unit, which is connected with the low-voltage signal VHL, the $Q_n$ node, the $P_n$ node, the output terminal $G_n$ and a first reset signal, and is configured to pull both the $Q_n$ node and the $P_n$ node down to a low level and simultaneously pull the output terminal $G_n$ up to a high level when the first reset signal jumps to a high level; and
   a second reset unit, which is connected with the low-voltage signal VHL, the output terminal $G_n$ and a second reset signal, and is configured to pull the output terminal $G_n$ down to a low level when the second reset signal jumps to a high level;
   wherein the $Q_n$ node precharging unit comprises a first transistor, a second transistor, a third transistor and a fourth transistor;
   wherein a source of the first transistor is connected with the high-voltage signal VGH, a gate thereof is connected with the second input signal $Q_{n+1}$, and a drain thereof is connected with a source of the second transistor;

wherein a gate of the second transistor is connected with the first input signal $Q_{n-1}$, and a drain thereof is connected with both a drain of the third transistor and the $Q_n$ node;

wherein a gate of the third transistor is connected with the first input signal $Q_{n-1}$, and a source thereof is connected with a drain of the fourth transistor; and wherein a gate of the fourth transistor is connected with the second input signal $Q_{n+1}$, and a source thereof is connected with the high-voltage signal VGH;

wherein during a forwarding scanning of the gate driving circuit, an output signal at the $Q_n$ node has a high level later than that of the first input signal $Q_{n-1}$ by a duration, and the second input signal $Q_{n+1}$ has a high level later than that of the output signal at the $Q_n$ node by the duration;

during a reverse scanning of the gate driving circuit, an output signal at the $Q_n$ node has a high level later than that of the second input signal $Q_{n+1}$ by the duration, and the first input signal $Q_{n-1}$ has a high level later than that of the output signal at the $Q_n$ node by the duration;

the first clock signal has a high level adjacent to that of the second clock signal; and a first time point at which the output signal at the $Q_n$ node jumps to the high level is same to a second time point at which a signal of an output terminal $G_{n-2}$ of an $(n-2)^{th}$ stage circuit, and a third time point at which the output signal at the $Q_n$ node jumps to a low level is same to a fourth time point at which a signal of an output terminal $G_{n+2}$ of an $(n+2)^{th}$ stage circuit.

2. The gate driving circuit according to claim 1, wherein the $Q_n$ node pull-down unit comprises a fifth transistor; and wherein a source of the fifth transistor is connected with the $Q_n$ node, a gate thereof is connected with the $P_n$ node, and a drain thereof is connected with the low-voltage signal VGL.

3. The gate driving circuit according to claim 2, wherein the $P_n$ node pull-up unit comprises a sixth transistor and a second capacitor;

wherein a source of the sixth transistor is connected with the high-voltage signal VGH, a gate thereof is connected with the first clock signal, and a drain thereof is connected with the $P_n$ node; and wherein two ends of the second capacitor are connected with the $P_n$ node and the low-voltage signal VGL, respectively.

4. The gate driving circuit according to claim 3, wherein the $P_n$ node pull-down unit comprises a seventh transistor; and wherein a source of the seventh transistor is connected with the $P_n$ node, a gate thereof is connected with the $Q_n$ node, and a drain thereof is connected with the low-voltage signal VGL.

5. The gate driving circuit according to claim 4, wherein the $G_n$ output terminal pull-down unit comprises a ninth transistor; and wherein a source of the ninth transistor is connected with the output terminal $G_n$, a gate thereof is connected with the $P_n$ node, and a drain thereof is connected with the low-voltage signal VGL.

6. The gate driving circuit according to claim 5, wherein the first reset unit comprises a tenth transistor, an eleventh transistor and a twelfth transistor;

wherein a source of the tenth transistor is connected with the $Q_n$ node, a gate thereof is connected with the first reset signal, and a drain thereof is connected with the low-voltage signal VGL;

wherein a source of the eleventh transistor is connected with the output terminal $G_n$, both a gate and a drain thereof are connected with the first reset signal; and wherein a source of the twelfth transistor is connected with the $P_n$ node, a gate thereof is connected with the first reset signal, and a drain thereof is connected with the low-voltage signal VGL.

7. The gate driving circuit according to claim 6, wherein the second reset unit comprises a thirteenth transistor; and wherein a source of the thirteenth transistor is connected with the output terminal $G_n$, a gate thereof is connected with the second reset signal, and a drain thereof is connected with the low-voltage signal VGL.

8. A driving method of a gate driving circuit, wherein the gate driving circuit has a multistage structure, and an $n^{th}$ stage circuit comprises:

a $Q_n$ node precharging unit, which controls signal transmission between a high-voltage signal VGH and a $Q_n$ node under an effect of a first input signal $Q_{n-1}$ and a second input signal $Q_{n+1}$, so as to precharge the $Q_n$ node, wherein the first input signal $Q_{n-1}$ is an output signal at a $Q_{n-1}$ node in an $(n-1)^{th}$ stage circuit and the second input signal $Q_{n+1}$ is an output signal at a $Q_{n+1}$ node in an $(n+1)^{th}$ stage circuit;

a $Q_n$ node pull-up unit, which is electrically connected between the $Q_n$ node and an output terminal $G_n$ to maintain the $Q_n$ node in a high-level state;

a $Q_n$ node pull-down unit, which is electrically connected between a low-voltage signal VGL and the $Q_n$ node to control signal transmission between the low-voltage signal VGL and the $Q_n$ node under an effect of a $P_n$ node voltage signal, so as to maintain the $Q_n$ node in a low-level state;

a $P_n$ node pull-up unit, which is electrically connected between the high-voltage signal VGH and a $P_n$ node to control signal transmission between the high-voltage signal VGH and the $P_n$ node under an effect of a first clock signal, so as to maintain the $P_n$ node in a high-level state;

a $P_n$ node pull-down unit, which is electrically connected between the low-voltage signal VGL and the $P_n$ node to control signal transmission between the low-voltage signal VGL and the $P_n$ node under an effect of a $Q_n$ node voltage signal, so as to maintain the $P_n$ node in a low-level state;

a $G_n$ output unit, which is electrically connected between a second clock signal and the output terminal $G_n$ to control signal transmission between the second clock signal and the output terminal $G_n$ under an effect of the $Q_n$ node voltage signal, so as to output a $G_n$ high-level signal;

a $G_n$ output terminal pull-down unit, which is electrically connected between the low-voltage signal VGL and the output terminal $G_n$ to control signal transmission between the low-voltage signal VGL and the output terminal $G_n$ under an effect of the $P_n$ node voltage signal, so as to maintain the output terminal $G_n$ in a low-level state;

a first reset unit, which is connected with the low-voltage signal VHL, the $Q_n$ node, the $P_n$ node, the output terminal $G_n$ and a first reset signal, and is configured to pull both the $Q_n$ node and the $P_n$ node down to a low level and simultaneously pull the output terminal $G_n$ up to a high level when the first reset signal jumps to a high level;

a second reset unit, which is connected with the low-voltage signal VHL, the output terminal $G_n$ and a second reset signal, and is configured to pull the output terminal $G_n$ down to a low level when the second reset signal jumps to a high level;

wherein the $Q_n$ node precharging unit comprises a first transistor, a second transistor, a third transistor and a fourth transistor;

wherein a source of the first transistor is connected with the high-voltage signal VGH, a gate thereof is connected with the second input signal $Q_{n+1}$, and a drain thereof is connected with a source of the second transistor;

wherein a gate of the second transistor is connected with the first input signal $Q_{n-1}$, and a drain thereof is connected with both a drain of the third transistor and the $Q_n$ node;

wherein a gate of the third transistor is connected with the first input signal $Q_{n-1}$, and a source thereof is connected with a drain of the fourth transistor; and wherein a gate of the fourth transistor is connected with the second input signal $Q_{n+1}$, and a source thereof is connected with the high-voltage signal VGH; and wherein in the driving method of the gate driving circuit, both the first reset signal Reset 1 and the second reset signal Reset 2 are maintained at a low level under normal display conditions;

in phase a, when the first input signal $Q_{n-1}$ and the second input signal $Q_{n+1}$ are both in a high-level state, the first and second transistors are both turned on and in series connection with each other, and the third and fourth transistors are also both turned on and in series connection with each other, so as to precharge the $Q_n$ node simultaneously;

in phase b, the $Q_n$ node is precharged in phase a, a first capacitor in the $Q_n$ node pull-up unit maintains the $Q_n$ node in a high-level state, the eighth transistor in the $G_n$ output unit is in a turned-on state, and a high level of the second clock signal is output to the output terminal $G_n$;

in phase c, the first capacitor in the $Q_n$ node pull-up unit continues to maintain the $Q_n$ node in the high-level state, while at this moment a low level of the second clock signal pulls down a level of the $G_n$ output terminal, and when the first input signal $Q_{n-1}$ and the second input signal $Q_{n+1}$ are simultaneously at high level, the first, second, third and fourth transistors are all turned on and in series connection with one another, and the $Q_n$ node is supplementarily charged;

in phase d, when the first clock signal is at a high level, the sixth transistor in the $P_n$ node pull-up unit is in a turned-on state, a level of the $P_n$ node is pulled up, the fifth transistor in the $Q_n$ node pull-down unit is turned on, and at this moment a level of the $Q_n$ node is pulled down to VGL;

in phase e, the seventh transistor in the $P_n$ node pull-down unit is in a turned-off state after the $Q_n$ node is changed to a low level, the sixth transistor is turned on when the first clock signal jumps to a high level, the $P_n$ node is charged, and then the fifth transistor, and the ninth transistor in the $G_n$ output terminal pull-down unit are both in a turned-on state, thus the stability of the low levels of the $Q_n$ node and the $G_n$ output terminal can be ensured, and meanwhile, the second capacitor plays a certain role in maintaining the high level of the $P_n$ node;

both the first reset signal Reset 1 and the second reset signal Reset 2 are maintained at a low level under normal display conditions, and thus the tenth transistor, the eleventh transistor, the twelfth transistor and the thirteenth transistor are all in a turned-off state;

during an All Gate On display state, the first reset signal Reset 1 is at a high level and the second reset signal Reset 2 is at a low level; when the first reset signal Reset 1 jumps to the high level, the tenth transistor, the eleventh transistor and the twelfth transistor are all in a turned-on state, while the thirteenth transistor is in a turned-off state, and at this moment, the $Q_n$ node and the $P_n$ node are both pulled down to low levels and the output terminal $G_n$ is pulled up to a high level; and during an All Gate Off display state, the first reset signal Reset 1 is at a low level and the second reset signal Reset 2 is at a high level; when the first reset signal Reset 1 is at the low level, the tenth transistor, the eleventh transistor and the twelfth transistor are all in a turned-off state, while the thirteenth transistor is in a turned-on state, and at this moment, the output terminal $G_n$ is pulled down to a low level.

9. A display device, comprising a gate driving circuit, wherein the gate driving circuit has a multistage structure, and an $n^{th}$ stage circuit comprises:

a $Q_n$ node precharging unit, which controls signal transmission between a high-voltage signal VGH and a $Q_n$ node under an effect of a first input signal $Q_{n-1}$ and a second input signal $Q_{n+1}$, so as to precharge the $Q_n$ node, wherein the first input signal $Q_{n-1}$ is an output signal at a $Q_{n-1}$ node in an $(n-1)^{th}$ stage circuit and the second input signal $Q_{n+1}$ is an output signal at a $Q_{n+1}$ node in an $(n+1)^{th}$ stage circuit;

a $Q_n$ node pull-up unit, which is electrically connected between the $Q_n$ node and an output terminal $G_n$ to maintain the $Q_n$ node in a high-level state;

a $Q_n$ node pull-down unit, which is electrically connected between a low-voltage signal VGL and the $Q_n$ node to control signal transmission between the low-voltage signal VGL and the $Q_n$ node under an effect of a $P_n$ node voltage signal, so as to maintain the $Q_n$ node in a low-level state;

a $P_n$ node pull-up unit, which is electrically connected between the high-voltage signal VGH and a $P_n$ node to control signal transmission between the high-voltage signal VGH and the $P_n$ node under an effect of a first clock signal, so as to maintain the $P_n$ node in a high-level state;

a $P_n$ node pull-down unit, which is electrically connected between the low-voltage signal VGL and the $P_n$ node to control signal transmission between the low-voltage signal VGL and the $P_n$ node under an effect of a $Q_n$ node voltage signal, so as to maintain the $P_n$ node in a low-level state;

a $G_n$ output unit, which is electrically connected between a second clock signal and the output terminal $G_n$ to control signal transmission between the second clock signal and the output terminal $G_n$ under an effect of the $Q_n$ node voltage signal, so as to output a $G_n$ high-level signal;

a $G_n$ output terminal pull-down unit, which is electrically connected between the low-voltage signal VGL and the output terminal $G_n$ to control signal transmission between the low-voltage signal VGL and the output terminal $G_n$ under an effect of the $P_n$ node voltage signal, so as to maintain the output terminal $G_n$ in a low-level state;

a first reset unit, which is connected with the low-voltage signal VHL, the $Q_n$ node, the $P_n$ node, the output terminal $G_n$ and a first reset signal, and is configured to pull both the $Q_n$ node and the $P_n$ node down to a low level and simultaneously pull the output terminal $G_n$ up to a high level when the first reset signal jumps to a high level; and a second reset unit, which is connected with the low-voltage signal VHL, the output terminal $G_n$ and a second reset signal, and is configured to pull the output terminal $G_n$ down to a low level when the second reset signal jumps to a high level;

wherein the $Q_n$ node precharging unit comprises a first transistor, a second transistor, a third transistor and a fourth transistor;

wherein a source of the first transistor is connected with the high-voltage signal VGH, a gate thereof is connected with the second input signal $Q_{n+1}$, and a drain thereof is connected with a source of the second transistor;

wherein a gate of the second transistor is connected with the first input signal $Q_{n-1}$, and a drain thereof is connected with both a drain of the third transistor and the $Q_n$ node;

wherein a gate of the third transistor is connected with the first input signal $Q_{n-1}$, and a source thereof is connected with a drain of the fourth transistor; and wherein a gate of the fourth transistor is connected with the second input signal $Q_{n+1}$, and a source thereof is connected with the high-voltage signal VGH.

10. The display device according to claim 9, wherein the $Q_n$ node pull-down unit comprises a fifth transistor; and wherein a source of the fifth transistor is connected with the $Q_n$ node, a gate thereof is connected with the $P_n$ node, and a drain thereof is connected with the low-voltage signal VGL.

11. The display device according to claim 10, wherein the $P_n$ node pull-up unit comprises a sixth transistor and a second capacitor;

wherein a source of the sixth transistor is connected with the high-voltage signal VGH, a gate thereof is connected with the first clock signal, and a drain thereof is connected with the $P_n$ node; and wherein two ends of the second capacitor are connected with the $P_n$ node and the low-voltage signal VGL, respectively.

12. The display device according to claim 11, wherein the $P_n$ node pull-down unit comprises a seventh transistor; and wherein a source of the seventh transistor is connected with the $P_n$ node, a gate thereof is connected with the $Q_n$ node, and a drain thereof is connected with the low-voltage signal VGL.

13. The display device according to claim 12, wherein the $G_n$ output terminal pull-down unit comprises a ninth transistor; and wherein a source of the ninth transistor is connected with the output terminal $G_n$, a gate thereof is connected with the $P_n$ node, and a drain thereof is connected with the low-voltage signal VGL.

14. The display device according to claim 13, wherein the first reset unit comprises a tenth transistor, an eleventh transistor and a twelfth transistor;

wherein a source of the tenth transistor is connected with the $Q_n$ node, a gate thereof is connected with the first reset signal, and a drain thereof is connected with the low-voltage signal VGL;

wherein a source of the eleventh transistor is connected with the output terminal $G_n$, both a gate and a drain thereof are connected with the first reset signal; and wherein a source of the twelfth transistor is connected with the $P_n$ node, a gate thereof is connected with the first reset signal, and a drain thereof is connected with the low-voltage signal VGL.

15. The display device according to claim 14, wherein the second reset unit comprises a thirteenth transistor; and wherein a source of the thirteenth transistor is connected with the output terminal $G_n$, a gate thereof is connected with the second reset signal, and a drain thereof is connected with the low-voltage signal VGL.

* * * * *